(12) United States Patent
Lin

(10) Patent No.: US 6,905,802 B2
(45) Date of Patent: Jun. 14, 2005

(54) MULTIPLE EXPOSURE METHOD FOR FORMING A PATTERNED PHOTORESIST LAYER

(75) Inventor: Cheng-Ming Lin, Hsin-Chu (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 58 days.

(21) Appl. No.: 10/637,862

(22) Filed: Aug. 9, 2003

(65) Prior Publication Data
US 2005/0032003 A1 Feb. 10, 2005

(51) Int. Cl.$^7$ .............................. G03F 9/00; G03C 5/00
(52) U.S. Cl. .............................. 430/5; 430/22; 430/296; 430/312; 430/327; 430/328; 430/394; 430/942; 430/945
(58) Field of Search .............................. 430/5, 22, 296, 430/312, 327, 328, 394, 942, 945

(56) References Cited

U.S. PATENT DOCUMENTS 6,194,103 B1    2/2001  Tzu et al. ................. 430/5
6,767,674 B2 *  7/2004  Carpi ....................... 430/5

* cited by examiner

Primary Examiner—Christopher G. Young
(74) Attorney, Agent, or Firm—Tung & Associates

(57) ABSTRACT

A method for exposing a blanket photoresist layer employs: (1) a first direct write exposure of the blanket photoresist layer to form therein an exposed peripheral sub-region of a desired exposed pattern; and (2) a second masked photoexposure of the blanket photoresist layer to form therein a masked photoexposed bulk sub-region of the desired exposed pattern which overlaps but does not extend beyond the exposed peripheral sub-region. The once masked photoexposed once direct write exposed blanket photoresist layer may be developed to form a patterned photoresist layer employed for forming a patterned opaque layer border within an opaque bordered attenuated phase shift mask.

20 Claims, 3 Drawing Sheets

MULTIPLE EXPOSURE METHOD FOR FORMING A PATTERNED PHOTORESIST LAYER

BACKGROUND OF THE INVENTION

1. Field of the Invention

The present invention relates generally to methods for forming patterned photoresist layers. More particularly, the present invention relates to methods for efficiently forming patterned photoresist layers for use as mask layers when fabricating phase shift masks.

2. Description of the Related Art

Phase shift masks provide advantage when photoexposing blanket photoresist layers employed for fabricating microelectronic products insofar as phase shift masks provide enhanced spatial resolution of actinic radiation.

While phase shift masks are thus clearly desirable in the microelectronic product fabrication art, they are nonetheless not entirely without problems.

In that regard, phase shift masks are often difficult to efficiently fabricate insofar as phase shift masks often require a complex fabrication sequence which provides phase shifting layers and ancillary layers within phase shift masks.

It is thus desirable in the microelectronic product fabrication art to provide methods for efficiently fabricating phase shift masks. It is towards the foregoing object that the present invention is directed.

Various methods have been disclosed in the microelectronic product fabrication art for forming phase shift masks with desirable properties.

Included but not limiting among the methods are those disclosed within Tzu et al., in U.S. Pat. No. 6,194,103 (an electron beam double exposure method for fabricating an opaque bordered attenuated phase shift mask).

Desirable in the microelectronic product fabrication art are additional methods for efficiently fabricating phase shift masks.

It is towards the foregoing object that the present invention is directed.

SUMMARY OF THE INVENTION

A first object of the invention is to provide a method for fabricating a phase shift mask.

A second object of the invention is to provide a method in accord with the first object of the invention, wherein the phase shift mask is efficiently fabricated.

In accord with the objects of the invention the invention provides a method for photoexposing a blanket photoresist layer when forming a patterned photoresist layer which may be employed for forming a patterned opaque border layer within an opaque bordered attenuated phase shift mask.

The method of the invention first provides a substrate having formed thereover a blanket photoresist layer. The method provides for exposing the blanket photoresist layer while employing a first direct write exposure method to form within the blanket photoresist layer an exposed peripheral sub-region of a desired exposed pattern. The exposed peripheral sub-region has an inner border and an outer border. The method also provides for photoexposing the blanket photoresist layer while employing a second masked photoexposure method to form within the blanket photoresist layer a masked photoexposed bulk sub-region of the desired exposed pattern. Within the method, the masked photoexposed bulk sub-region overlaps the inner border but does not reach the outer border, to form the desired exposed pattern within a once masked photoexposed once direct write exposed blanket photoresist layer.

Within the invention, the once masked photoexposed once direct write exposed blanket photoresist layer may be developed to form a patterned photoresist layer for use as an etch mask layer when forming a patterned opaque border layer within an opaque bordered attenuated phase shift mask.

The invention provides a method for fabricating a phase shift mask, wherein the phase shift mask is efficiently fabricated.

The invention realizes the foregoing object within the context of forming a patterned photoresist layer which may be employed as an etch mask for forming a patterned opaque layer within an opaque bordered attenuated phase shift mask by employing a two-step exposure method for forming a photoexposed blanket photoresist layer from which is formed the patterned photoresist layer. The two step exposure method employs: (1) a first direct write exposure method for forming a peripheral sub-region of a desired exposed pattern; and (2) a second masked photoexposure method for forming a bulk sub-region of the desired pattern. Within the invention, the bulk sub-region overlaps but does not extend beyond the peripheral sub-region, to thus form a once masked photoexposed once direct write exposed blanket photoresist layer which is developed to form the patterned photoresist layer.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The invention provides a method for fabricating a phase shift mask, wherein the phase shift mask is efficiently fabricated.

The invention realizes the foregoing object within the context of forming a patterned photoresist layer which may be employed as an etch mask for forming a patterned opaque layer within an opaque bordered attenuated phase shift mask by employing a two-step exposure method for forming a photoexposed blanket photoresist layer from which is formed the patterned photoresist layer. The two step exposure method employs: (1) a first direct write exposure method for forming a peripheral sub-region of a desired exposed pattern; and (2) a second masked photoexposure method for forming a bulk sub-region of the desired pattern. Within the invention, the bulk sub-region overlaps but does not extend beyond the peripheral sub-region, to thus form a once mask photoexposed once direct write exposed blanket photoresist layer which is developed to form the patterned photoresist layer.

FIG. 1 to FIG. 8 show a series of schematic cross-sectional diagrams illustrating the results of progressive stages of fabricating an attenuated phase shift mask in accord with a preferred embodiment of the invention.

Figure 1:
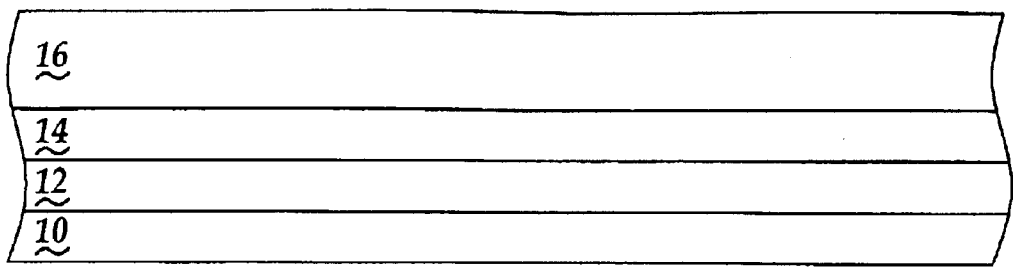
FIG. 1, FIG. 2, FIG. 3, FIG. 4, FIG. 5, FIG. 6, FIG. 7 and FIG. 8 show a series of schematic cross-sectional diagrams illustrating the results of progressive stages of fabricating an attenuated phase shift mask in accord with a preferred embodiment of the invention.

FIG. 1 shows a schematic cross-sectional diagram of the attenuated phase shift mask at an early stage in its fabrication in accord with the preferred embodiment of the invention.

FIG. 1 shows a transparent substrate 10 having formed thereupon a blanket attenuating phase shift material layer 12 in turn having formed thereupon a blanket opaque material layer 14 finally in turn having formed thereupon a blanket first photoresist layer 16.

Within the invention, the transparent substrate 10 is typically a transparent quartz substrate, although transparent substrates formed of other materials which are transparent to a dose of actinic photoexposure radiation may also be employed. Typically, the transparent substrate 10 is formed to a thickness of from about 3 to about 10 mm.

Within the invention, the blanket attenuating phase shift material layer 12 may be formed of an attenuating phase shift material as is otherwise generally conventional or unconventional in the attenuated phase shift mask fabrication art. Typically, the blanket attenuating phase shift material layer 12 is formed of a attenuating phase shift material such as but not limited to a molybdenum silicon oxynitride (MoSiON), chromium oxide (Cro), chromium nitride (CrN), zirconium silicon oxide (ZrSiO) or aluminum chromium oxide (AlCrO) attenuating phase shift material. Typically, the blanket attenuating phase shift material layer 12 is formed to a thickness of from about 900 to about 1350 angstroms.

Within the invention, the blanket opaque material layer 14 (which may alternatively be considered as a blanket target layer of any composition or conductivity within the context of a general embodiment of the invention) is typically formed of an opaque metal material such as but not limited to an aluminum, aluminum alloy, chromium or chromium alloy opaque metal material (but in particular a chromium opaque material), formed to a thickness of from about 500 to about 1000 angstroms.

Finally, within the invention, the blanket first photoresist layer 16 may be formed of either a positive photoresist material or a negative photoresist material (which provide complementary exposure and development properties (i.e., complementary soluble and insoluble regions)) as is otherwise known in the microelectronic product fabrication art. Typically, the blanket first photoresist layer 16 is formed of a positive photoresist material formed to a thickness of from about 10000 to about 20000 angstroms.

Figure 2:
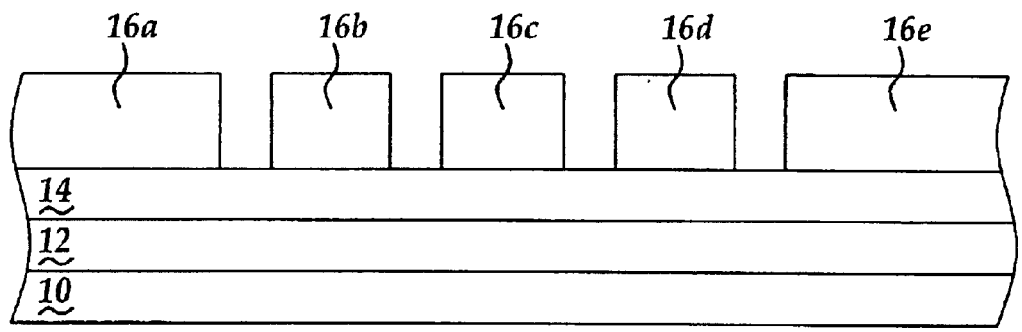

FIG. 2 shows a schematic cross-sectional diagram illustrating the results of further processing of the attenuated phase shift mask of FIG. 1.

FIG. 2 illustrates the results of exposing and developing the blanket first photoresist layer 16 to form a series of patterned first photoresist layers 16a, 16b, 16c, 16d and 16e upon the blanket opaque material layer 14.

Within the invention, the blanket first photoresist layer 16 is typically exposed and developed to form the series of patterned photoresist layers 16a, 16b, 16c, 16d and 16e while employing a direct write exposure method, such as an electron beam or a laser beam direct write exposure method.

Figure 3:
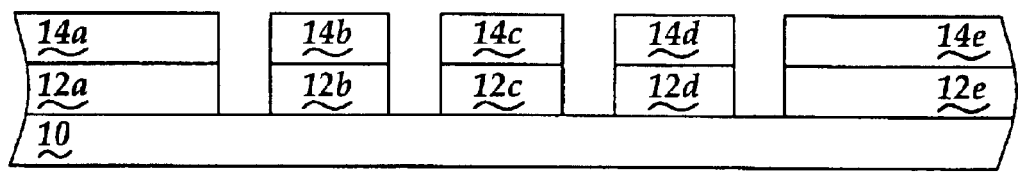

FIG. 3 shows a schematic cross-sectional diagram illustrating the results of further processing of the attenuated phase shift mask of FIG. 2.

FIG. 3 shows the results of: (1) forming a series of patterned opaque material layers 14a, 14b, 14c, 14d and 14e from the blanket opaque material layer 14; (2) forming a series of patterned attenuating phase shift material layers 12a, 12b, 12c, 12d and 12e from the blanket attenuating phase shift material layer 12; and (3) stripping from the series of patterned opaque material layers 14a, 14b, 14c, 14d and 14e the series of patterned first photoresist layers 16a, 16b, 16c, 16d and 16e. The series of patterned opaque material layers 14a, 14b, 14c, 14d and 14e is formed from the blanket opaque material layer 14 while employing the series of patterned first photoresist layers 16a, 16b, 16c, 16d and 16e as a series of etch mask layers. The series of patterned attenuating phase shift material layers 12a, 12b, 12c, 12d and 12e is formed from the blanket attenuating phase shift material layer 12 while employing at least the series of patterned opaque material layers 14a, 14b, 14c, 14d and 14e as an etch mask layer. Typically, each of the blanket opaque material layer 14 and the blanket attenuating phase shift material layer 12 is etched to form the corresponding series of patterned layers while employing an appropriate plasma etchant.

Figure 4:
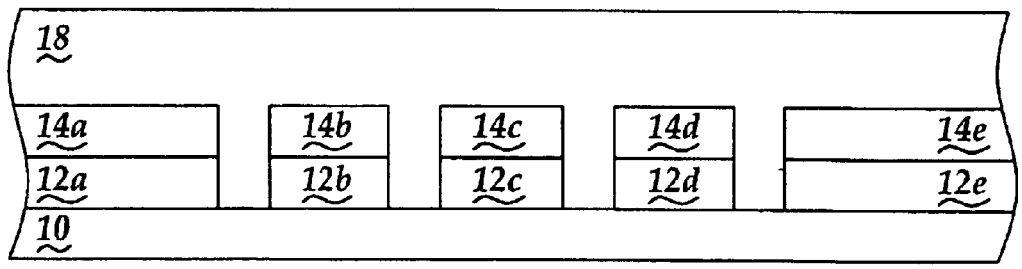

FIG. 4 shows a schematic cross-sectional diagram illustrating the results of further processing of the attenuated phase shift mask of FIG. 3.

FIG. 4 shows the results of forming a blanket second photoresist layer 18 upon the attenuated phase shift mask whose schematic cross-sectional diagram is illustrated in FIG. 3, such that the blanket second photoresist layer 18 is formed upon exposed portions of the transparent substrate 10, the series of patterned attenuating phase shift material layers 12a, 12b, 12c, 12d and 12e and the series of patterned opaque material layers 14a, 14b, 14c, 14d and 14e.

Within the invention, the blanket second photoresist layer 18 may be formed employing methods, materials and dimensions analogous, equivalent or identical to the methods, materials and dimensions employed for forming the blanket first photoresist layer 16 as illustrated in FIG. 1. Similarly, while a general embodiment of the invention may employ either a positive photoresist material or a negative photoresist material for forming the blanket second photoresist layer 18, a blanket second photoresist layer 18 formed of a positive photoresist material is typically more common and will be illustrated (for example and without limitation) within the context of further processing of the attenuated phase shift mask whose schematic cross-sectional diagram is illustrated in FIG. 4.

Figure 5:
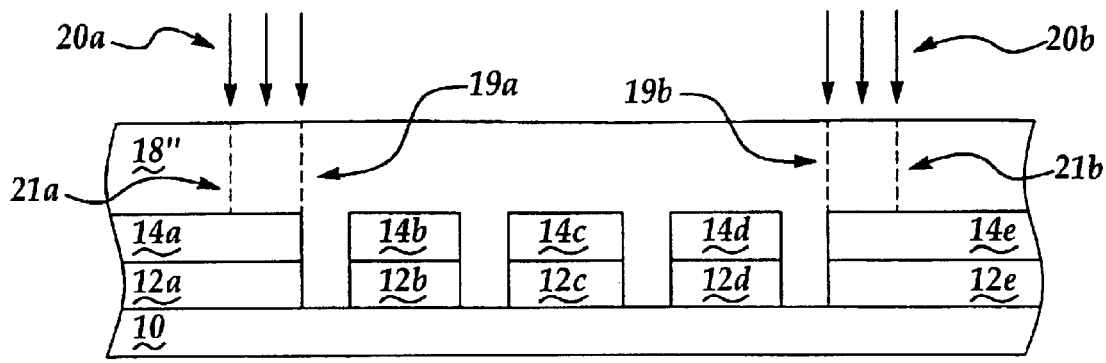

FIG. 5 shows a schematic cross-sectional diagram illustrating the results of further processing of the attenuated phase shift mask of FIG. 4.

FIG. 5 shows the results of exposing the blanket second photoresist layer 18 while employing a first direct write exposure method employing a pair of first direct write exposure beams 20a and 20b, to form a direct write exposed blanket second photoresist layer 18'. Within the invention, the pair of direct write exposure beams 20a and 20b forms within the direct write exposed blanket second photoresist layer 18' a pair of exposed peripheral subregions of a desired exposed pattern discussed in greater detail below. As is further illustrated in FIG. 5, the pair of exposed peripheral sub-regions has a pair of inner boundaries 19a and 19b (i.e., inner borders) and a pair of outer boundaries 21a and 21b (i.e., outer borders).

Within the invention, the pair of direct write exposure beams 20a and 20b may comprise direct write beams including but not limited to direct write electron beams and direct write laser beams. Typically, the pair of direct write exposure beams 20a and 20b comprise direct write electron beams.

Figure 6:
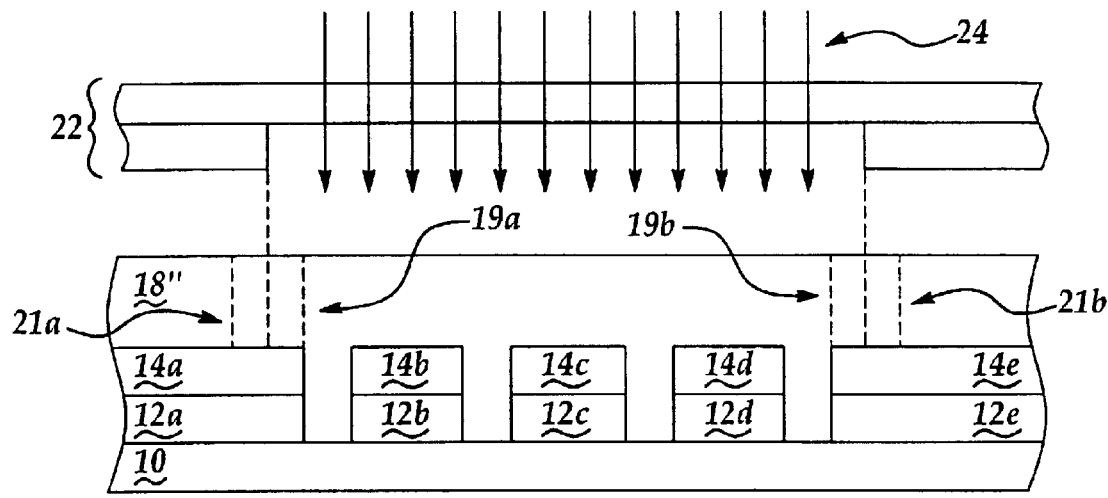

FIG. 6 shows a schematic cross-sectional diagram illustrating the results of further processing of the attenuated phase shift mask of FIG. 5.

FIG. 6 shows the results of photoexposing the direct write exposed blanket second photoresist layer 18', while employing a photomask 22 in conjunction with a photoexposure beam 24, to form a once masked photoexposed once direct write exposed blanket second photoresist layer 18". Within the invention, the photoexposure beam 24 provides a bulk sub-region within the once masked photoexposed once direct write exposed blanket second photoresist layer 18", where the bulk sub-region overlaps the inner boundaries 19a and 19b of the pair of peripheral sub-regions, but does not reach the pair of outer boundaries 21a and 21b of the pair of peripheral sub-regions. Thus, the desired photoexposed pattern which comprises in an aggregate the peripheral sub-regions and the partially overlapping bulk sub-region has an outer periphery boundary defined and exposed employing a first direct write exposure method and a bulk interior sub-region filled and photoexposed employing a second masked photoexposure method. Use of the second masked photoexposure method for filling the bulk interior sub-region provides for enhanced efficiency insofar as direct write exposure methods are generally slower exposure methods in comparison with masked photoexposure methods.

While FIG. 5 and FIG. 6 illustrate a direct write exposure method followed by a masked photoexposure method for forming the once masked photoexposed once direct write exposed blanket second photoresist layer 18", a reverse ordering of those methods is also within the context of the invention.

Figure 7:
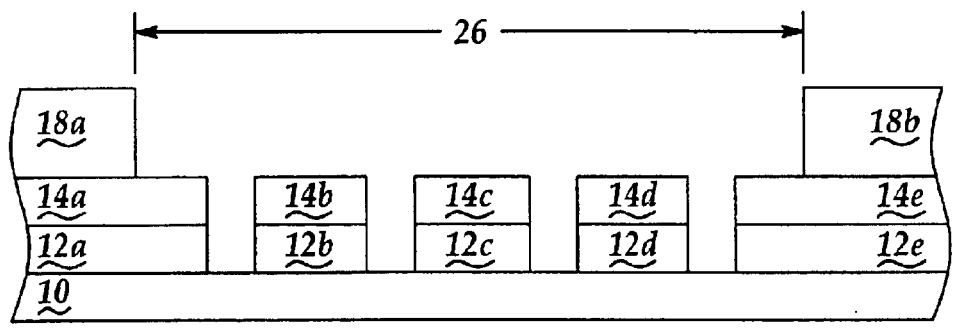

FIG. 7 shows a schematic cross-sectional diagram illustrating the results of further processing of the attenuated phase shift mask of FIG. 6.

FIG. 7 shows the results of developing the once masked photoexposed once direct write exposed blanket second photoresist layer 18" to form a pair of patterned second photoresist layers 18a and 18b which define an aperture region 26 (corresponding with and derived from the desired exposed pattern within the once masked photoexposed once direct write exposed blanket second photoresist layer 18") which leaves fully exposed the series of patterned opaque material layers 14b, 14c and 14d and leaves partially exposed the pair of patterned opaque material layers 14a and 14e.

Within the invention, the once masked photoexposed once direct write exposed blanket second photoresist layer 18" may be developed to form the pair of patterned second photoresist layers 18a and 18b while employing development methods and materials as are otherwise generally conventional in the microelectronic product fabrication art.

Figure 8:
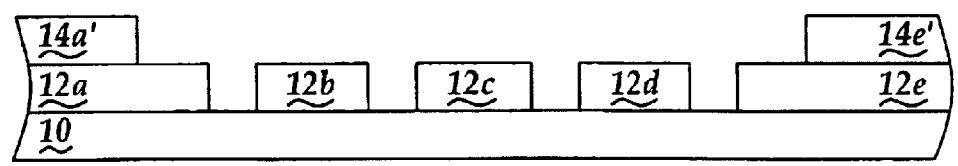

FIG. 8 shows a schematic cross-sectional diagram illustrating the results of further processing of the attenuated phase shift mask of FIG. 7.

FIG. 8 in a first instance illustrates the results of: (1) stripping the patterned opaque material layers 14b, 14c and 14d from the series of patterned attenuated phase shift material layers 12b, 12c and 12d; and (2) patterning the pair of patterned opaque material layers 14a and 14e to form a pair of twice patterned opaque material layers 14a' and 14e', while employing the pair of patterned second photoresist layers 18a and 18b as a pair of mask layers. The foregoing stripping and patterning may be effected while employing etch methods and materials as are generally conventional in the microelectronic product fabrication art.

Finally, FIG. 8 also illustrates the results of stripping the pair of patterned second photoresist layers 18a and 18b from the pair of twice patterned opaque material layers 14a' and 14e'. The pair of patterned second photoresist layers 1a and 18b may be stripped from the pair of twice patterned opaque material layers 14a' and 14e' while employing methods as are conventional in the microelectronic product fabrication art.

FIG. 8 illustrates an opaque bordered attenuated phase shift mask fabricated in accord with a preferred embodiment of the invention. The opaque bordered attenuated phase shift mask has a patterned opaque layer peripheral border which serves to prevent border radiation emitted through a patterned attenuating phase shift material layer from spuriously exposing adjacent portions of a blanket photoresist layer not intended to be exposed when employing the opaque bordered attenuated phase shift mask. When forming the patterned opaque layer border, a blanket photoresist layer is exposed employing a two step method which employs: (1) a first direct write exposure method for exposing with precision a peripheral sub-region of a desired exposed pattern; and (2) a second masked photoexposure method for exposing with speed a bulk sub-region of the desired exposed pattern which overlaps an inner boundary of the peripheral sub-region but does not extend beyond an outer boundary of the peripheral sub-region.

Figure 9A:
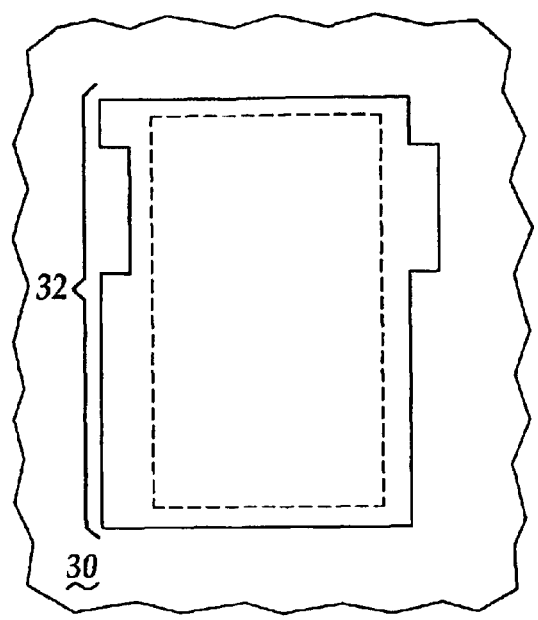
FIG. 9A, FIG. 9B and FIG. 9C show a series of schematic plan view diagrams illustrating with respect to a blanket photoresist layer: (1) a desired exposed pattern therein; (2) a direct write exposed peripheral sub-region thereof; and (3) a masked photoexposed bulk sub-region thereof, when fabricating a patterned photoresist layer in accord with the present invention.
Figure 9B:
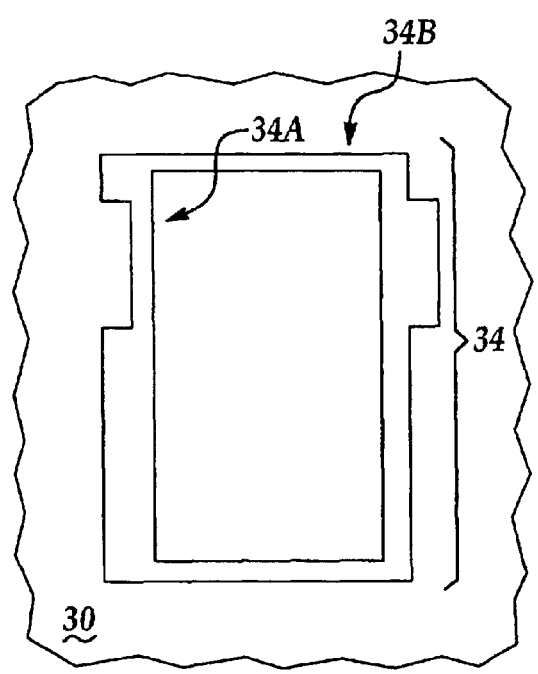
Figure 9C:
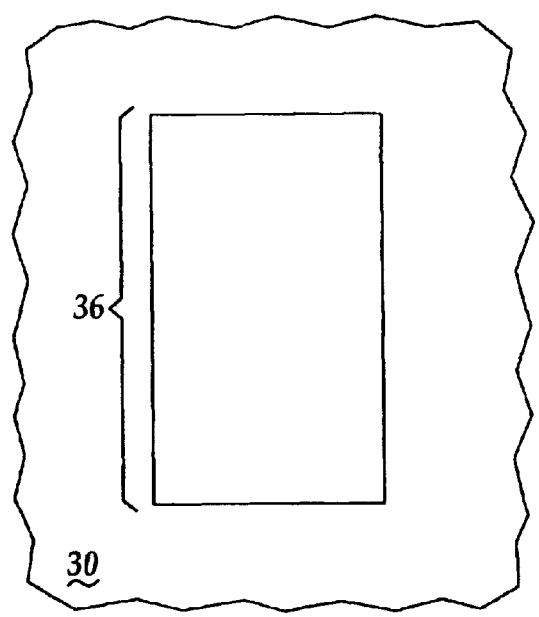

FIGS. 9A to 9C show a series of schematic plan view diagrams illustrating with respect to a blanket photoresist layer: (1) a desired exposed pattern therein; (2) a direct write exposed peripheral sub-region thereof; and (3) a masked photoexposed bulk sub-region thereof, when fabricating a patterned photoresist layer in accord with the present invention as illustrated within FIG. 1 to FIG. 8.

FIG. 9A illustrates the desired exposed pattern 32 within a photoresist layer 30 which corresponds with the aperture 26 within the patterned photoresist layer 18a/18b developed from the once masked photoexposed once direct write exposed blanket photoresist layer 18" as illustrated in FIG. 6 and FIG. 7. FIG. 9B illustrates a peripheral sub-region 34 of the desired exposed pattern 32, where the peripheral sub-region 34 has an inner border 34a and an outer border 34b. FIG. 9C illustrates a bulk sub-region 36 of the desired exposed pattern 32. Within FIG. 9B the peripheral sub-region is exposed employing a direct write exposure method and within FIG. 9C the bulk sub-region is photoexposed employing a mask photoexposure method.

The preferred embodiment of the invention is illustrative of the invention rather than limiting of the invention. Revisions and modifications may be made to materials, structures and dimensions in accord with the preferred embodiment of the invention while still providing an embodiment in accord with the invention, further in accord with the accompanying claims.

What is claimed is:

1. A method for photoexposing a blanket photoresist layer comprising:

providing a substrate;

forming over the substrate a blanket photoresist layer;

exposing the blanket photoresist layer while employing a first direct write exposure method to form within the blanket photoresist layer an exposed peripheral sub-region of a desired exposed pattern, the exposed peripheral sub-region having an inner border and an outer border; and photoexposing the blanket photoresist layer while employing a second masked photoexposure method to form within the blanket photoresist layer a masked photoexposed bulk sub-region of the desired exposed pattern, where the masked photoexposed bulk sub-region overlaps the inner border but does not reach the outer border, to form the desired exposed pattern within a once masked photoexposed once direct write exposed blanket photoresist layer.

2. The method of claim 1 further comprising developing the once masked photoexposed once direct write exposed blanket photoresist layer to form a patterned photoresist layer.

3. The method of claim 1 wherein the first direct write exposure method employs an electron beam.

4. The method of claim 1 wherein the first direct write exposure method employs an electron beam.

5. The method of claim 1 wherein the exposed peripheral sub-region is formed before the masked photoexposed bulk sub-region.

6. The method of claim 1 wherein the masked photoexposed bulk sub-region is formed before the exposed peripheral sub-region.

7. A method for forming a patterned layer comprising:

providing a substrate;

forming over the substrate a target layer;

forming upon the target layer a blanket photoresist layer;

exposing the blanket photoresist layer while employing a first direct write exposure method to form within the blanket photoresist layer an exposed peripheral sub-region of a desired exposed pattern, the exposed peripheral sub-region having an inner border and an outer border;

photoexposing the blanket photoresist layer while employing a second masked photoexposure method to form within the blanket photoresist layer a masked photoexposed bulk sub-region of the desired exposed pattern, where the masked photoexposed bulk sub-region overlaps the inner border but does not reach the outer border, to form the desired exposed pattern within a once masked photoexposed once direct write exposed blanket photoresist layer;

developing the once masked photoexposed once direct write exposed blanket photoresist layer to form a patterned photoresist layer; and employing the patterned photoresist layer as an etch mask for etching the target layer to form a patterned target layer.

8. The method of claim 7 wherein the target layer is formed of an opaque material.

9. The method of claim 7 wherein the first direct write exposure method employs ab electron beam.

10. The method of claim 7 wherein the first direct write exposure method employs a laser beam.

11. The method of claim 7 wherein the exposed peripheral sub-region is formed before the masked photoexposed bulk sub-region.

12. The method of claim 7 wherein the masked photoexposed bulk sub-region is formed before the exposed peripheral sub-region.

13. A method for forming a phase shift mask comprising:

providing a transparent substrate;

forming over the transparent substrate a patterned attenuating phase shift material layer;

forming aligned upon the patterned attenuating phase shift material layer a patterned opaque material layer;

forming upon exposed portions of the transparent substrate, the patterned attenuating phase shift material layer and the patterned opaque material layer a blanket photoresist layer;

exposing the blanket photoresist layer while employing a first direct write exposure method to form within the blanket photoresist layer an exposed peripheral sub-region of a desired exposed pattern, the exposed peripheral sub-region having an inner border and an outer border;

photoexposing the blanket photoresist layer while employing a second masked photoexposure method to form within the blanket photoresist layer a masked photoexposed bulk sub-region of the desired exposed pattern, where the masked photoexposed bulk sub-region overlaps the inner border but does not reach the outer border, to form the desired exposed pattern within a once masked photoexposed once direct write exposed blanket photoresist layer;

developing the once masked photoexposed once direct write exposed blanket photoresist layer to form a patterned photoresist layer; and employing the patterned photoresist layer as an etch mask for further etching the patterned opaque material layer to form a twice patterned opaque material layer border which leaves exposed a surface portion of the patterned attenuating phase shift material layer.

14. The method of claim 13 wherein the patterned attenuating phase shift material layer is formed to a thickness of from about 900 to about 1350 angstroms.

15. The method of claim 13 wherein the patterned opaque material layer is formed of chromium.

16. The method of claim 13 wherein the patterned opaque material layer is formed to a thickness of from about 500 to about 1000 angstroms.

17. The method of claim 13 wherein the first direct write exposure method employs an electron beam.

18. The method of claim 13 wherein the first direct write exposure method employs a laser beam.

19. The method of claim 13 wherein the exposed peripheral sub-region is formed before the masked photoexposed bulk sub-region.

20. The method of claim 13 wherein the masked photoexposed bulk before the exposed peripheral sub-region.

* * * * *